United States Patent
Kim et al.

(10) Patent No.: US 7,759,795 B2
(45) Date of Patent: Jul. 20, 2010

(54) PRINTED CIRCUIT BOARD HAVING RELIABLE BUMP INTERCONNECTION STRUCTURE, METHOD OF FABRICATING THE SAME, AND SEMICONDUCTOR PACKAGE USING THE SAME

(75) Inventors: Young-Lyong Kim, Gyeonggi-do (KR); Young-Shin Choi, Chungcheongnam-do (KR); Jong-Gi Lee, Chungcheongnam-do (KR); Kun-Dae Yeom, Chungcheongnam-do (KR); Chul-Yong Jang, Busan (KR); Hyun-Jong Woo, Gyeonggi-do (KR)

(73) Assignee: Samsung Electronics Co., Ltd., Yeongtong-gu, Suwon-si, Gyeonggi-do (KR)

(*) Notice: Subject to any disclaimer, the term of this patent is extended or adjusted under 35 U.S.C. 154(b) by 426 days.

(21) Appl. No.: 11/850,576

(22) Filed: Sep. 5, 2007

(65) Prior Publication Data
US 2008/0054462 A1   Mar. 6, 2008

(30) Foreign Application Priority Data
Sep. 6, 2006   (KR) ...................... 10-2006-0085883

(51) Int. Cl.
*H01L 23/48* (2006.01)
*H01L 23/52* (2006.01)

(52) U.S. Cl. ................ 257/737; 257/774; 257/E23.067
(58) Field of Classification Search ................. 257/737, 257/774, E23.067
See application file for complete search history.

(56) References Cited

U.S. PATENT DOCUMENTS

| | | | | |
|---|---|---|---|---|
| 5,216,807 A | * | 6/1993 | Yoshizawa et al. ............ 29/876 |
| 5,401,689 A | * | 3/1995 | Frei et al. ...................... 29/830 |
| 5,434,452 A | * | 7/1995 | Higgins, III ................. 257/773 |
| 5,969,418 A | * | 10/1999 | Belanger, Jr. ............... 257/737 |
| 6,285,562 B1 | | 9/2001 | Zakel et al. |
| 6,596,634 B2 | * | 7/2003 | Umetsu et al. .............. 438/666 |

(Continued)

FOREIGN PATENT DOCUMENTS

JP    2000-200962    7/2000

(Continued)

OTHER PUBLICATIONS

English language abstract of Japanese Publication No. 2000-200962.

(Continued)

*Primary Examiner*—Nitin Parekh
(74) *Attorney, Agent, or Firm*—Muir Patent Consulting, PLLC

(57) ABSTRACT

Provided is a printed circuit board having a bump interconnection structure that improves reliability between interconnection layers. Also provided is a method of fabricating the printed circuit board and semiconductor package using the printed circuit board. According to one embodiment, the printed circuit board includes a plurality of bumps formed on a resin layer between a first interconnection layer and a second interconnection layer. The second interconnection layer includes insertion holes corresponding to upper portions of the bumps so that the upper portions of the bumps protrude from the second interconnection layer. The upper portion of at least one of the bumps includes a rivet portion having a diameter greater that the diameter of the corresponding insertion hole to reliably interconnect the first and second interconnection layers.

15 Claims, 6 Drawing Sheets

U.S. PATENT DOCUMENTS

| | | | |
|---|---|---|---|
| 6,812,549 B2* | 11/2004 | Umetsu et al. | 257/621 |
| 6,867,121 B2* | 3/2005 | Harvey | 438/612 |
| 7,292,055 B2* | 11/2007 | Egitto et al. | 324/754 |
| 7,292,056 B2* | 11/2007 | Matsuda | 324/754 |
| 7,371,974 B2* | 5/2008 | Toyoda et al. | 174/262 |
| 2004/0060174 A1* | 4/2004 | Imafuji et al. | 29/831 |
| 2004/0140560 A1* | 7/2004 | Harvey | 257/737 |
| 2004/0245623 A1* | 12/2004 | Hara et al. | 257/698 |
| 2005/0167829 A1* | 8/2005 | Brunner et al. | 257/737 |

FOREIGN PATENT DOCUMENTS

| | | |
|---|---|---|
| KR | 2005-0029602 | 3/2005 |

OTHER PUBLICATIONS

English language abstract of Korean Publication No. 2005-0029602.

\* cited by examiner

PRINTED CIRCUIT BOARD HAVING RELIABLE BUMP INTERCONNECTION STRUCTURE, METHOD OF FABRICATING THE SAME, AND SEMICONDUCTOR PACKAGE USING THE SAME

CROSS-REFERENCE TO RELATED PATENT APPLICATION

This application claims the benefit of Korean Patent Application No. 10-2006-0085883, filed on Sep. 6, 2006, in the Korean Intellectual Property Office, the disclosure of which is incorporated herein in its entirety by reference.

BACKGROUND

1. Field of the Invention

The present invention relates to a printed circuit board (PCB) having a bump interconnection structure, and more particularly to a printed circuit board having a reliable bump interconnection structure, a method of fabricating the same, and a semiconductor package using the same.

2. Description of the Related Art

Generally, respective layers of a multi-layered printed circuit board are interconnected by mechanically processes to form holes in and plate the printed circuit board. These conventional interconnection methods, however, cannot decrease the area of the printed circuit board, perform fine mountings, obtain freedom of design, nor obtain low electrical resistance. In order to address these problems, a bump interconnection structure, i.e., Neo Manhattan Bump Interconnection (NMBI), has been suggested.

FIGS. 1 through 4 are sectional views illustrating a method of fabricating a conventional printed circuit board having an NMBI structure. FIGS. 5 and 6 are partially enlarged sectional views illustrating a hot pressing process (method) of FIG. 3 in more detail.

Referring to FIGS. 1 and 2, copper bumps 12 are formed on a first interconnection layer 10 composed of a copper rail by electro-plating. Then, a resin layer 14, such as a polyimide layer is laminated on the copper bumps 12.

Referring to FIGS. 3, 5, and 6, a second interconnection layer 16, such as a copper foil is disposed on the copper bumps 12 and the resin layer 14. The first interconnection layer 10 is interconnected to the second interconnection layer 16 by the copper bumps 12. That is, the second interconnection layer 16 and the first interconnection layer 10 are pressed as denoted by the arrows in FIG. 6 to reduce the volume of the copper bumps 12 by hot pressing; thereby bonding the second interconnection layer 16 and the copper bumps 12.

Referring to FIG. 4, the first interconnection layer 10 and the second interconnection layer 16 are patterned as required, thereby forming first interconnection layer patterns 10a and second interconnection layer patterns 16a. In this manner, the first interconnection layer patterns 10a and the second interconnection layer patterns 16a are interconnected via the copper bumps 12.

However, as illustrated in FIGS. 4 and 6, a crack may occur in the hot pressed portion 18 of the conventional printed circuit board when the second interconnection layer 16 is hot pressed to the copper bumps 12. When the printed circuit board involving the crack is subjected to reliability tests, such as a temperature cycle test and a dropping test, the hot pressed portion 18 may become separated. That is, the second interconnection layer pattern 16a may separate from the copper bump 12. Therefore, the reliability of the conventional printed circuit board may be substantially degraded due to this potentially problematic hot pressed portion 18.

Similarly, when a semiconductor package, in which a semiconductor chip (not shown) is interconnected to the first interconnection pattern 10a of the printed circuit board, is subjected to reliability tests, such as the temperature cycle test and the dropping test, the hot pressed portion 18 may be separated; thereby degrading the semiconductor package.

SUMMARY

The present invention provides a printed circuit board having a bump interconnection structure that improves reliability between interconnection patterns (or an interconnection layers) and bumps by well bonding the interconnection patterns and the bumps.

The present invention also provides a method of fabricating the printed circuit board having the bump interconnection structure to improve the reliability.

The present invention further provides a semiconductor package using the printed circuit board with the improved reliability between the interconnection layer patterns and the bumps.

According to an embodiment of the present invention, a printed circuit board includes a plurality of bumps formed on a first interconnection layer. A resin layer formed on the first interconnection layer is formed lower than the bumps to expose upper portions of the bumps while insulating the bumps. A second interconnection layer formed on the resin layer includes insertion holes correspondingly fitted with the bumps such that the second interconnection layer is interconnected to the first interconnection layer via the bumps.

In this embodiment, the upper portion of at least one bump may include a rivet portion having a diameter greater than that of the insertion hole.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
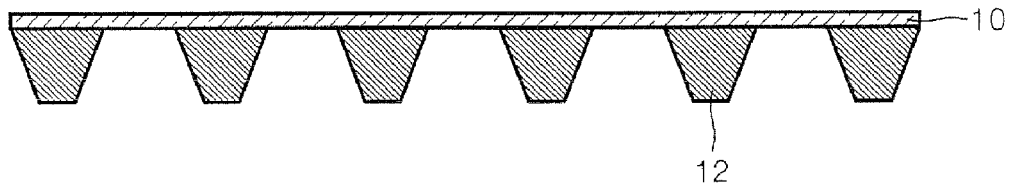
FIGS. 1 through 4 are sectional views illustrating a method of fabricating a conventional printed circuit board having an NMBI structure.
Figure 2:
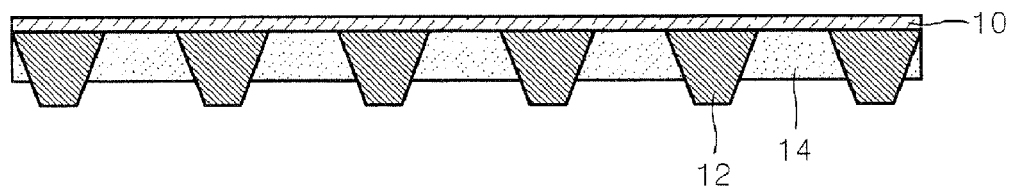
Figure 3:
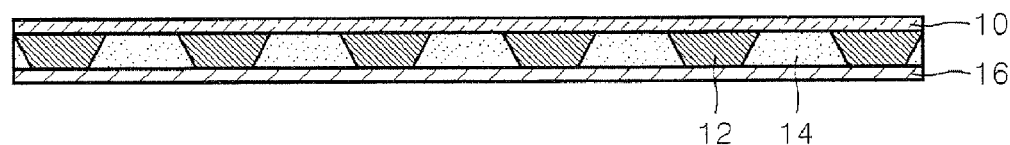
Figure 4:
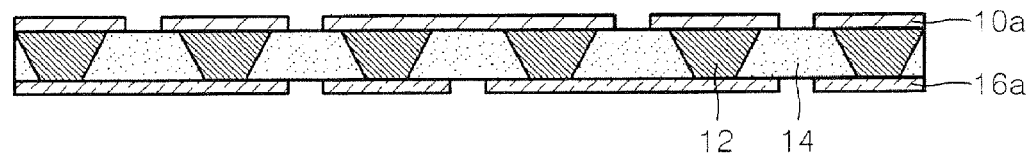
Figure 5:
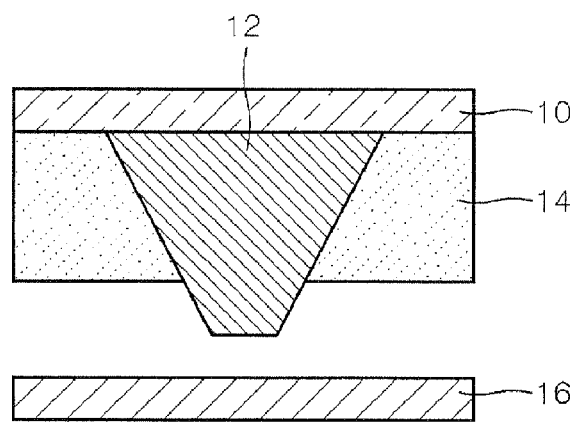
FIGS. 5 and 6 are partially enlarged sectional views illustrating a hot pressing process shown in FIG. 3 in more detail.
Figure 6:
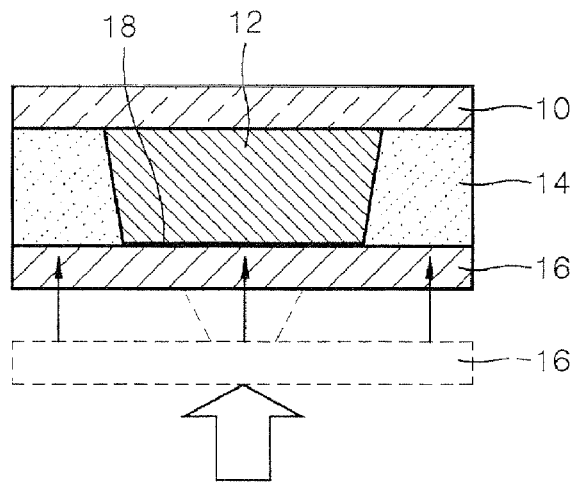

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Like reference numerals in the drawings denote like elements, and thus their description will not be repeated.

Figure 9:
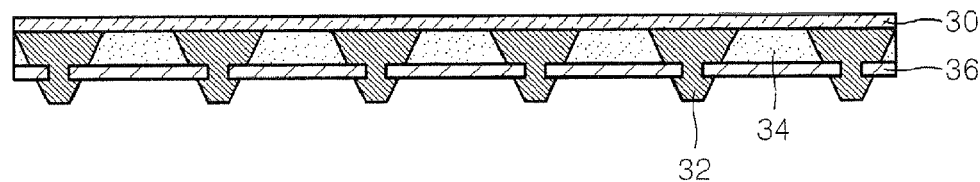
Figure 13:
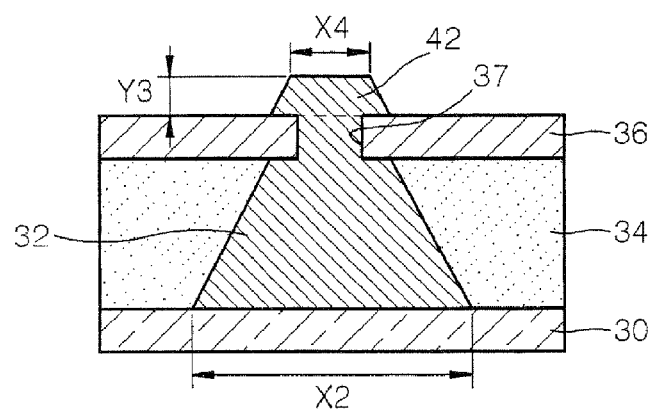

FIGS. 9 and 13 illustrate the structure of a printed circuit board according to embodiments of the present invention. For convenience in describing these embodiments, FIG. 9 illustrates only a single unit printed circuit board. However, a multi-layered printed circuit board may be formed when a resin layer, i.e., an insulating layer, is inserted between the unit printed circuit boards to form a stack comprising a plurality of printed circuit boards. Of course, when being used as electronic components, either one printed circuit board or the multi-layered printed circuit board may be used. FIG. 13 illustrates a partially enlarged sectional view of the printed circuit board shown in FIG. 9.

Referring to FIGS. 9 and 13, a plurality of bumps 32 are formed on a first interconnection layer 30. The first interconnection layer 30 may include a copper rail, i.e., a copper layer. The bumps 32 may include copper and may be formed on the first interconnection layer 30 by electro-plating. The bumps 32 may be bonded in a robust manner to the first interconnection layer 30 due to the electro-plating process. The bumps 32 are further interconnected to a second interconnection layer 36, and may act as micro-vias.

A resin layer 34 is formed on the first interconnection layer 30 as an insulating layer for insulating the bumps 32. An upper surface of the resin layer 34 may be lower than the upper surfaces of the bumps 32. The second interconnection layer 36 may be formed on the resin layer 34 and include insertion holes 37 correspondingly fitted with the bumps 32. The second interconnection layer 36 is interconnected to the first interconnection layer 30 via the bumps 32. The second interconnection layer 36 may include copper.

An upper portion of the bump 32 may include a rivet portion 42 with a diameter larger than the diameter of the insertion hole 37 protrudes from an upper surface of the second interconnection layer 36. The rivet portion 42 of the bump 32 may insure that the second interconnection layer 36 is reliably bonded to the first interconnection layer 30. The protruding rivet portion 42 may be formed by a rivet process in which the upper portion of the bump 32 is processed to have a diameter larger than the diameter of the insertion hole 37. Consequently, the second interconnection layer 36 may be reliably bonded to the first interconnection layer 30 by the rivet portion 42.

Hereinafter, a method of fabricating the printed circuit board according to embodiments of the present invention will be described.

The printed circuit board illustrated in FIGS. 7 through 10 is a single unit for convenience of description, as mentioned above. However, a plurality of unit printed circuit boards may be stacked by inserting one or more resin layers as insulating layers between each of the unit printed circuit boards to fabricate a multi-layered printed circuit board.

Figure 11:
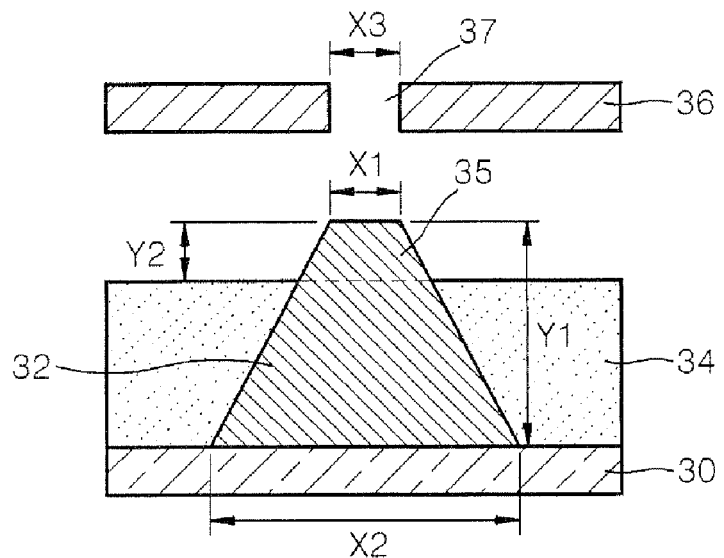
FIGS. 11 through 13 are partially enlarged sectional views illustrating a hot pressing process shown in FIG. 9 in more detail.
Figure 12:
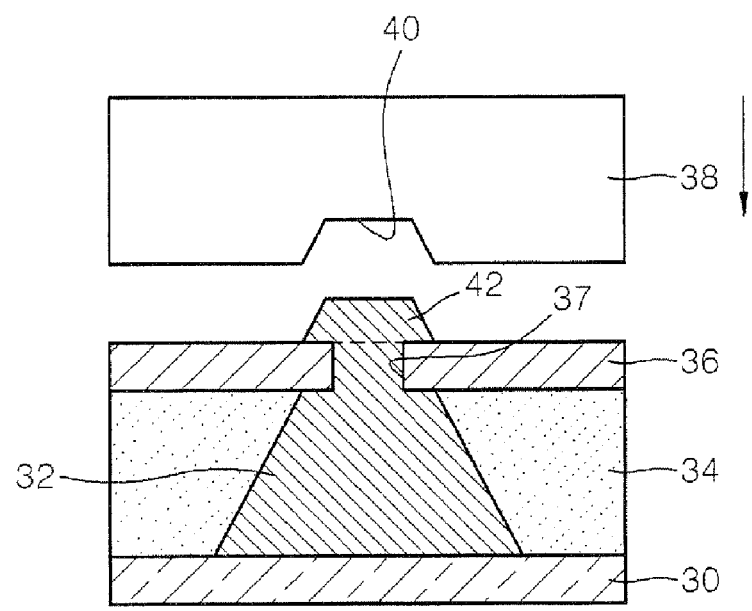

FIGS. 7 through 10 are sectional views illustrating a method of fabricating a printed circuit board having a bump interconnection structure according to an embodiment of the present invention. FIGS. 11 through 13 are partially enlarged sectional views illustrating hot pressing process shown in FIG. 9 in more detail.

Figure 7:
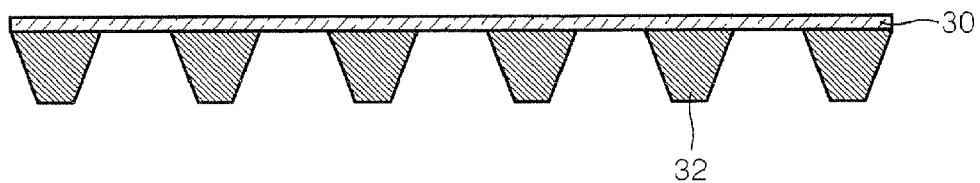
FIGS. 7 through 10 are sectional views illustrating a method of fabricating a printed circuit board having a bump interconnection structure according to an embodiment of the present invention.
Figure 8:
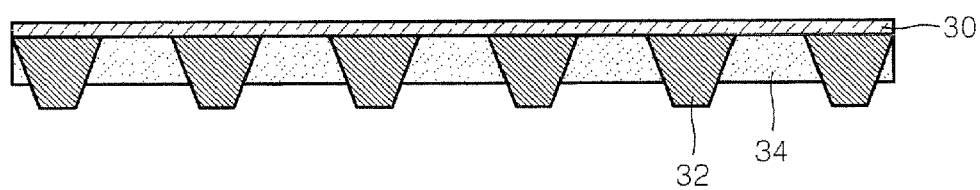

Referring to FIGS. 7 and 8, the plurality of bumps 32 are formed on the first interconnection layer 30, which may include a copper rail, i.e., a copper layer, by electro-plating. As mentioned above, the bumps 32 may include copper. Additionally, as discussed above, the bumps 32 may be robustly bonded to first interconnection layer 30 through the electro-plating process. The bumps 32 may be structured as micro-vias, which will be interconnected to the second interconnection layer 36 later. The surface of the first interconnection layer 30 may be formed to be relatively smooth instead of uneven.

Subsequently, the resin layer 34, such as a polyimide layer is laminated on the first interconnection layer 30 to be lower than the bumps 32. By doing so, the bumps 32 may be at least partially insulated by the resin layer 34 have an upper portion that protrudes above the resin layer 34 (see also element 35 of FIG. 1).

Referring to FIGS. 9, 11, 12, and 13, the second interconnection layer 36, which may be composed of copper foil, i.e., a copper layer, is positioned on the bumps 32 and the resin layer 34. As shown in FIG. 9, the second interconnection layer 36 may have insertion holes 37 correspondingly fitted with the bumps 32. That is, the second interconnection layer 36 may include openings 37 that correspond to the location of the bumps 32 such that when the second interconnection layer 36 is positioned on the bumps 32, top portions of the bumps fit through the openings 37. Then, the second interconnection layer 36 is hot bonded to the bumps 32 by a hot pressing process, so that the second interconnection layer 36 is connected to the first interconnection layer 30 via the bumps 32.

Hereinafter, a method of hot pressing the second interconnection layer 36 with the insertion hole 37 to the bump 32 will be described with reference to FIGS. 11 through 13.

Referring to FIG. 11, the bump 32 has a lower diameter X2, an upper diameter X1, and a height Y1. The lower diameter X2 and the upper diameter X1 may not be substantially different, but are illustrated as being substantially different in FIG. 11 for convenience and clarity. Since the height Y1 of the bump 32 formed on the first interconnection layer 30 is greater than that of the resin layer 34, an upper portion of the bump 32 projects above the resin layer 34 by a height of Y2. As mentioned above, the second interconnection layer 36 has one or more insertion holes 37 corresponding to the positions of the one or more bumps 32, where each of the insertion holes has a diameter X3 that is substantially similar to the upper diameter X1 of the bumps 32. The second interconnection layer 36 is then placed on the resin layer 34, such that the upper portion of the bump 32 projects thought the opening 37.

Referring to FIGS. 12 and 13, the second interconnection layer 36 having the insertion hole 37 and the first interconnection layer 30 are hot pressed as denoted by the arrow shown in FIG. 12, thereby hot pressing the second interconnection layer 36 to the bump 32 and the resin layer 34. A rivet head 38 is used during the hot pressing of the second interconnection layer 36. A portion of the lower end surface of the rivet head 38 has a groove 40, which helps to form the rivet portion 42 of the bump 32 (as shown in FIG. 13) by pressing the upper portion 35 of the projecting bump 32.

When the upper portion 35 of the protruding bump 32 is subjected to the hot pressing using the rivet head 38, the upper portion 35 of the bump 32 is processed as a rivet portion 42 with a diameter X4 that is greater than the diameter X3 of the insertion hole 37. The rivet portion 42 protrudes to a height Y3 from the upper surface of the second interconnection layer 36 and the resin layer 34. The protruding height Y3 of the rivet portion 42 may be slightly lower than the non-rivet height Y2 due to the rivet processing during the hot press. Because the diameter X4 of the rivet portion 42 is greater than the diameter X3 of the insertion hole 37, the second interconnection layer 36 and the bump 32 may be reliably bonded by the rivet form. It is illustrated that, when rivet processing, the second interconnection layer 36 is completely bonded to the resin layer 34. However, the second interconnection layer 36 may not be adhered to or formed directly on the resin layer 34, such as when an intermediate or insertion member (not shown) is formed on the resin layer 34.

As a result of the rivet formation, the printed circuit board according to the above embodiment of the present invention has no crack located between the second interconnection layer 36 and the bump 32 because the second interconnection layer 36 and the bumps 32 are reliably bonded using the rivet portion 42. Therefore, when the printed circuit board according to the present invention is subjected to reliability tests, such as the temperature cycle test and the dropping test, the hot pressed portion is not separated, which significantly improves the reliability of the circuit boards. The temperature cycle test is performed for about 30 minutes at a temperature of about −65° C. and for about 30 minutes at a temperature of about 125° C. over the course of about 700 cycles.

Again referring to FIG. 10, the first interconnection layer 30 and the second interconnection layer 36 are patterned as needed to form first interconnection layer patterns 30a and second interconnection layer patterns 36a. By doing so, the first interconnection layer patterns 30a and the second interconnection layer patterns 36a are interconnected by the bumps 32.

Figure 14:
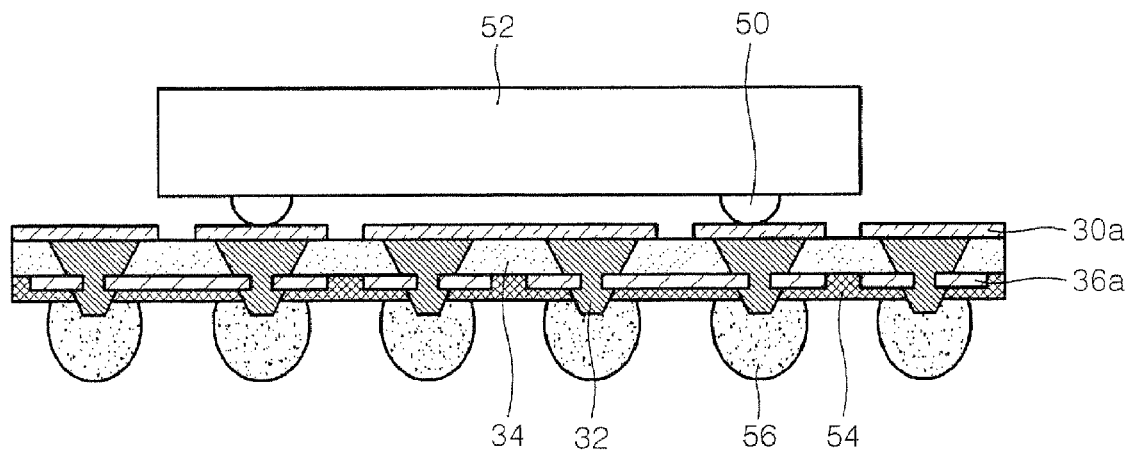
FIG. 14 is a sectional view illustrating a semiconductor package using a printed circuit board according to another embodiment of the present invention.
Figure 15:
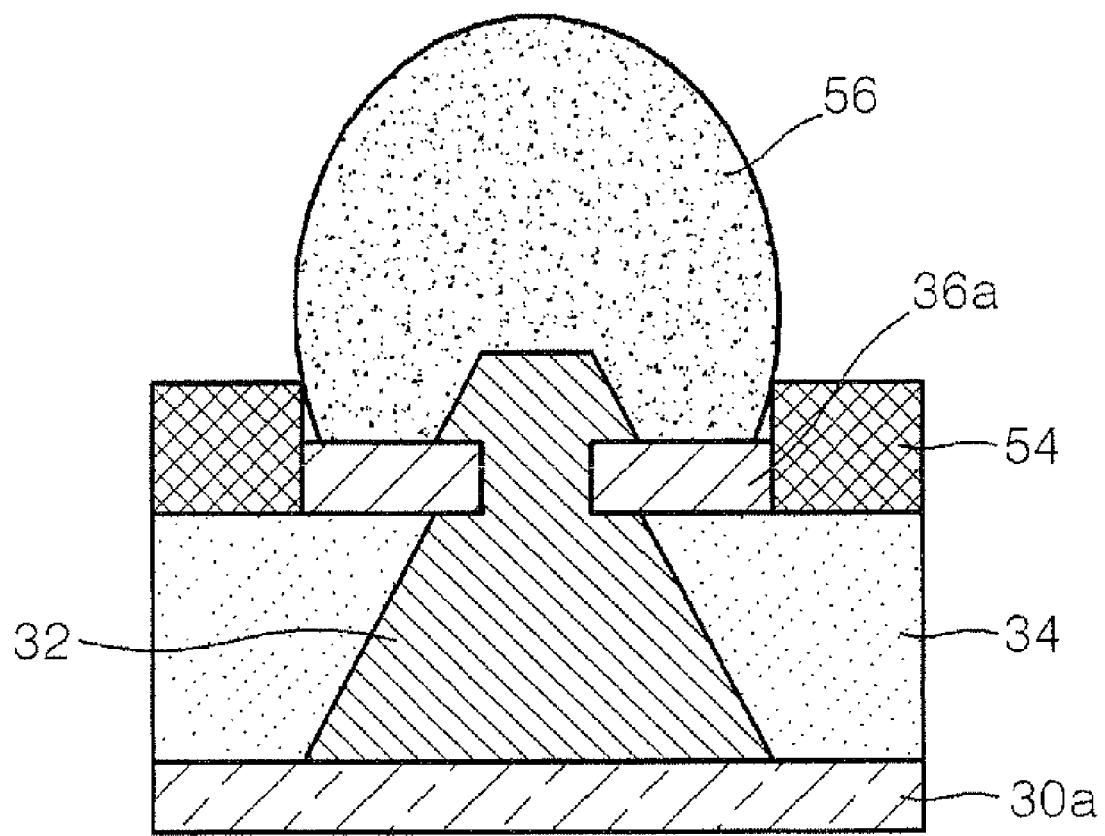
FIG. 15 is an enlarged sectional view illustrating an interconnection pad for the semiconductor package shown in FIG. 14.

FIG. 14 is a sectional view illustrating a semiconductor package using a printed circuit board according to another embodiment of the present invention and FIG. 15 is an enlarged sectional view illustrating an interconnection pad for the semiconductor package shown in FIG. 14. Referring to FIGS. 14 and 15, solder mask patterns 54 are formed on the circuit board to at least partially cover the second interconnection layer patterns 36a and portions of the resin layer 34. Solder bumps (or solder balls) 56 may also be formed on the second interconnection layer patterns 36a over the rivet portion 42 of the bumps 32 to facilitate connection terminals for the printed circuit board.

The embodiments of the semiconductor package shown in these figures may also be used to stack semiconductor chips. For example, as shown in FIG. 14, a semiconductor chip 52 may be stacked on the first interconnection layer patterns 30a of the printed circuit board illustrated in FIG. 10 using interconnection pads 50 to connect the chip 52 to the printed circuit board. Additionally, the semiconductor package illustrated in FIG. 14 may include a single layer of external connections of a ball grid array (BGA) type or a film package type. As described above, the multi-layered package may be obtained by stacking the single-layered packages multiple times. The present invention can embody the multi-layered package as well as the single layer package. Additionally, the printed circuit board according to the present invention can be applied to any package as well as the BGA type package or the film type package.

Figure 10:
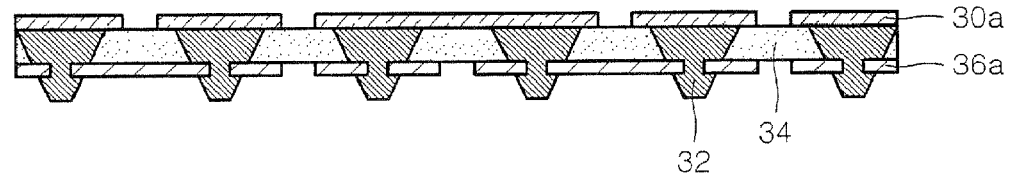

More specifically, a semiconductor chip 52 may be stacked on the first interconnection layer patterns 30a of the printed circuit board illustrated in FIG. 10 using interconnection pads 50 as signal connections paths for the chip 52. Additionally, the solder mask patterns 54 may be formed on the second interconnection layer patterns 36a and exposed resin portions 34. The solder bumps (or solder balls) 56 may then be formed on the second interconnection layer pattern 36a and the rivet portions 42 of the bumps 32.

Because the solder bumps 56 are formed on the projecting rivet portions 42, the solder bumps 56 may be interconnected to the second interconnection layer patterns 36a and the bumps 32 to improve the solder bonding reliability as shown in FIG. 15. Therefore, the semiconductor package according to embodiments of the present invention provide substantially improved reliability over conventional printed circuit boards because the bonding portions of the solder bumps 56, the second interconnection layer patterns 36a, and the bumps 32 do not easily become separated during reliability tests, such as the temperature cycle test and the dropping test. The second interconnection layer patterns 36a, the bumps 32, and the solder bumps 56 act as the interconnection pads for the semiconductor package when being connected onto a mother board (not shown).

In the printed circuit board according to embodiments of the present invention as described above, a second interconnection layer and bumps are reliably bonded using the second interconnection layer patterns having insertion holes correspondingly fitted with the upper portions of the bumps, which are hot pressed to form rivet portions. In particular, the second interconnection layer and the bumps are reliably bonded by the rivet portions, thereby improving the reliability.

Also, in a method of fabricating a printed circuit board according to the present invention, the second interconnection layer having the insertion holes correspondingly fitted with the bumps are pressed to the bumps having exposed upper portions by a hot pressing process, thereby forming rivet portions by rivet processing. By doing so, the second interconnection layer and the bumps are bonded well using the rivet portions.

Furthermore, a semiconductor package can be embodied by bonding a semiconductor chip on the printed circuit board and forming bumps having the rivet portions and solder bumps on the second interconnection layer patterns, thereby improving solder bonding reliability.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A printed circuit board comprising:
   a plurality of bumps formed on a first interconnection layer;
   a resin layer formed directly on the first interconnection layer, wherein upper portions of the plurality of bumps protrude from the resin layer; and
   a second interconnection layer formed directly on the resin layer, the second interconnection layer including insertion holes respectively formed to correspond with the bumps,
   wherein the upper portion of at least one of the bumps includes a rivet portion protruding from the second interconnection layer, the diameter of the rivet portion in contact with an upper surface of the second interconnection layer being greater than a diameter of the respective insertion hole at the upper surface of the second interconnection layer.

2. The printed circuit board of claim 1, wherein the plurality of bumps are micro-vias that interconnect the first interconnection layer to the second interconnection layer.

3. The printed circuit board of claim 1, wherein the first interconnection layer and the second interconnection layer are copper layers, and the plurality of bumps are copper bumps formed by electro-plating.

4. The printed circuit board of claim 1, wherein the second interconnection layer is patterned to form second interconnection layer patterns.

5. The printed circuit board of claim 4, further comprising:
solder mask patterns formed on the second interconnection layer patterns, wherein portions of the second interconnection layer patterns are exposed by the solder mask patterns; and
solder bumps formed on the exposed portions of the second interconnection layer patterns.

6. A printed circuit board comprising:
a plurality of bumps formed on a first interconnection layer;
a resin layer formed directly on the first interconnection layer to insulate the bumps; and
a second interconnection layer formed directly on the resin layer and interconnected to the first interconnection layer via the bumps, the second interconnection layer including a plurality of insertion holes respectively corresponding to the bumps, wherein each bump includes a rivet portion protruding above the second interconnection layer and having a diameter at the rivet portion that contacts an upper surface of the second interconnection layer being greater than a diameter of the corresponding insertion hole at the upper surface of the second interconnection layer.

7. The printed circuit board of claim 6, wherein the first interconnection layer and the second interconnection layer are copper layers, and the bump is a copper bump formed by electro-plating.

8. A semiconductor package comprising:
a plurality of bumps formed on first interconnection layer patterns;
a resin layer formed directly on the first interconnection layer patterns, wherein upper portions of the plurality of bumps protrude from the resin layer;
second interconnection layer patterns formed directly on the resin layer, the second interconnection layer patterns including insertion holes respectively formed to correspond with the bumps;
a semiconductor chip formed on an upper surface of the resin layer and upper surfaces of the first interconnection layer patterns, the semiconductor chip being interconnected to the first interconnection layer pattern;
solder mask patterns formed on the second interconnection layer patterns, wherein portions of the second interconnection layer patterns are exposed from the solder mask patterns; and
solder bumps formed on the exposed portions of the second interconnection layer patterns,
wherein the upper portion of each bump includes a rivet portion protruding from the second interconnection layer, the diameter of the rivet portion in contact with an upper surface of the second interconnection layer being greater than a diameter of the respective insertion hole at the upper surface of the second interconnection layer.

9. The semiconductor package of claim 8, wherein the plurality of bumps are micro-vias that interconnect the first interconnection layer pattern to the second interconnection layer pattern.

10. The semiconductor package of claim 8, wherein the first interconnection layer and the second interconnection layer are copper layers, and the plurality of bumps are copper bumps formed by electro-plating.

11. The semiconductor package of claim 8, being a ball grid array type package.

12. A semiconductor package comprising:
a plurality of bumps formed on a first interconnection layer;
a resin layer formed directly on the first interconnection layer to insulate the bumps;
a second interconnection layer formed directly on the resin layer and interconnected to the first interconnection layer via the bumps, the second interconnection layer including a plurality of insertion holes respectively corresponding to the bumps, wherein each bump includes a rivet portion protruding above the second interconnection layer and having a diameter at the rivet portion that contacts an upper surface of the second interconnection layer being greater than a diameter of the corresponding insertion hole at the upper surface of the second interconnection layer;
a semiconductor chip formed on an upper surface of the resin layer and an upper surface of the first interconnection layer, the semiconductor chip interconnected to the first interconnection layer;
solder mask patterns formed on the second interconnection layer, wherein portions of the second interconnection layer are exposed from the solder mask patterns; and
solder bumps formed on the exposed portions of the second interconnection layer patterns.

13. The semiconductor package of claim 12, wherein the plurality of bumps are micro-vias that interconnect the first interconnection layer patterns to the second interconnection layer patterns.

14. The semiconductor package of claim 12, wherein the first interconnection layer and the second interconnection layer are copper layers, and the plurality of bumps are copper bumps formed by electro-plating.

15. The semiconductor package of claim 12, being a ball grid array type package.

* * * * *